United States Patent
Liu et al.

(10) Patent No.: US 7,598,107 B1
(45) Date of Patent: Oct. 6, 2009

(54) SEMI-SACRIFICIAL MOLD FOR DIAMOND STRUCTURES

(75) Inventors: Hongbing Liu, Richmond, CA (US);
Victor B. Kley, Berkeley, CA (US)

(73) Assignee: Metadigm LLC, Berkeley, CA (US)

( * ) Notice: Subject to any disclaimer, the term of this patent is extended or adjusted under 35 U.S.C. 154(b) by 493 days.

(21) Appl. No.: 11/234,066

(22) Filed: Sep. 23, 2005

Related U.S. Application Data

(60) Provisional application No. 60/612,910, filed on Sep. 23, 2004.

(51) Int. Cl.
*H01L 21/00* (2006.01)
(52) U.S. Cl. ............... 438/48; 438/52; 438/105; 257/E21.603
(58) Field of Classification Search ............ 438/48, 438/51, 52, 105; 257/E21.603
See application file for complete search history.

(56) References Cited

U.S. PATENT DOCUMENTS

| | | | | |
|---|---|---|---|---|
| 5,443,032 A | * | 8/1995 | Vichr et al. | 117/84 |
| 5,587,210 A | * | 12/1996 | Marchywka et al. | 427/523 |
| 7,037,370 B2 | * | 5/2006 | Mearini et al. | 117/68 |
| 7,323,111 B1 | * | 1/2008 | Kley | 216/2 |

* cited by examiner

*Primary Examiner*—David S Blum
(74) *Attorney, Agent, or Firm*—Townsend and Townsend and Crew LLP

(57) ABSTRACT

A patterned structure forms a portion of the mold for a diamond molded structure but is separable from the mold by the same processes that release the diamond part. The mold portion may itself be a component in a MEMS or NEMS structure or device or the precursor to such a structure or device. The mold portion may be made from sapphire or silicon carbide. The mold portion may be coated and polished to obtain an optically smooth surface over the diamond mold inside pit. The coating may be formed from one or more of silicon carbide, PTFE, silicon nitride, silicon dioxide, sapphire, a metal, a plastic, and an epoxy.

18 Claims, 2 Drawing Sheets

SEMI-SACRIFICIAL MOLD FOR DIAMOND STRUCTURES

CROSS REFERENCE TO RELATED APPLICATIONS

This application claims priority from U.S. Provisional Patent Application No. 60/612,910, filed Sep. 23, 2005 by Hongbing Liu and Victor B. Kley for "Semi-Sacrificial Mold for Diamond Structures," the entire disclosure of which is incorporated by reference for all purposes.

This application incorporates the disclosures of the following U.S. patents and patent applications by reference:

- U.S. Pat. No. 6,144,028 for "A Scanning Probe Microscope Assembly and Corresponding Method for Making Confocal, Spectrophotometric, Near-Field, and Scanning Probe Measurements and Forming Associated Images from the Measurements";
- U.S. Pat. No. 6,252,226 for "Nanometer Scale Data Storage Device and Associated Positioning System";
- U.S. Pat. No. 6,337,479 for "Object Inspection and/or Modification System and Method";
- U.S. Pat. No. 6,339,217 for "Scanning Probe Microscope Assembly and Method for Making Spectrophotometric, Near-Field, and Scanning Probe Measurements"; and
- U.S. patent application Ser. No. 11/048,611 filed Jan. 31, 2005, now U.S. Pat. No. 7,323,111 issued Jan. 29, 2008 for "Angle Control of Multi-Cavity Molded Components for MEMS and NEMS Group Assembly."

BACKGROUND AND SUMMARY OF THE INVENTION

The present invention relates generally to techniques for selectively growing diamond in conjunction with silicon, quartz, sapphire, silicon oxide, silicon nitride, silicon carbide or other medium to high temperature material suitable for diamond growth. It provides a broad process solution for any system in which a diamond mold can be formed and separated by materials suitable as etch resists to remove any portion of the mold structure. In particular it relates to integrating diamond tip structures on cantilevers for Scanning Probe Microscopy in processes easily manufactured using conventional equipment and process techniques which can be used to make high yield wafer quantities of such integrated tip structures. This technique is related to that earlier disclosed in the above-referenced U.S. patent application Ser. No. 11/048,611 (now U.S. Pat. No. 7,323,111) in which the separated tip structure is further bonded to a separate silicon or other material or MEMS structure.

The present invention relates more specifically to techniques for preparing a silicon on insulator ("SOI") wafer so that diamond may be grown into a mold on the device layer or handle layer which and after growth the portion of the device which is to be exposed as a tip or other diamond structure is exposed by removal of the surrounding mold material.

The primary embodiment is an AFM Guided Nanomachining or indentation tip. The principal elements of the device consist of an SOI wafer on which a series of squares have been patterned along with cantilever structures and other marks and elements. Typically this pattern is on the device layer of an SOI wafer, after etching the exposed silicon oxide in the square hole is removed and the a wet etch is used in the exposed square pit to etch a self limiting four sided pyramidal recess ending in a point or straight edge depending on the crystal orientation of the silicon and/or precision of the square. Thus on 100 silicon a perfect square self-limits in a wet etch to a point, and a rectangle self-limits to a straight edge whose length depends or the ratio of the starting rectangles sides. Off axis silicon produces a point and a tilted pyramid with the proper rectangle. After the tip structure is formed additional MEMS structures may be added to the diamond and/or silicon (or other material such as sapphire, or silicon carbide) by silicon oxide bonding, metallic bonding or the use of adhesives to bond to any other material including silicon, sapphire, glass, fused or single crystal silica, plastics or metals.

In another embodiment the device is made from a sapphire or silicon carbide wafer which has been coated with polysilicon and then silicon oxide bonded to a silicon wafer after which the sapphire is reduced to a proper thickness for the MEMS function (typically a 2 to 50 micron thickness for SPM cantilevers) and the process herein made by patterning and etching the sapphire or silicon carbide, dry etching through the polysilicon, removal of the silicon oxide followed by wet etching of the self terminating pyramidal pit in the silicon wafer. The wafer is then processed to grow the diamond as described elsewhere. This process has the advantage that the end product can be readily metal bonded to any substrate including glass, quartz, silicon, or any metal (with a reasonable melting point at or above 100° C.). Further the mold material may be wet etched with common means to remove the mold silicon, polysilicon and silicon oxide without concern for damage to the MEMS (typically cantilever) structure. Further the polysilicon can be separately patterned for breakaway structures protected by silicon dioxide while the main mold silicon material can be removed by an etch which is preferential for silicon.

In a further embodiment the wafer structure as above can be coated by a layer of metal or other material such as a PTFE, epoxy or plastic after the silicon mold wafer is removed and used in a CMP, thermal annealing, or other process provide a final finish on the device side in which the thick coating has filled the diamond coated pit forming the inside of the molded diamond part such that a good optical surface is formed over the diamond structure. This can be particularly important for the manufacture of reliable SPM tips.

In yet another embodiment a secondary wafer or individual structure is bonded by any means to cantilever backside to form an optically smooth surface and increase the cantilever thickness and resonant frequency.

In a further embodiment the finished structure and in particular a cantilever is bonded to a substrate for transport and handling purposes by bonding to any of a glass, quartz, plastic, silicon, sapphire, machinable ceramic, ceramic, metal or other suitable substrate material prepared for each individual cantilever, small group or the entire wafer full of cantilevers.

In another embodiment the structure (particularly low force AFM cantilevers) is made from strong and flexible material such as silicon nitride or silicon carbide, diamond, diamond like carbon, carbon nanotubes, inert metals such as gold, palladium, platinum or rhodium. As above this structure with diamond molded part may be overcoated and/or CMP'd before the mold release etch and bonded to a suitable substrate. For example a low force classic double arm contact cantilever with diamond tip for AFM applications may be made by etching a 100 to 200 nanometer low stress silicon nitride film deposited on a single side polished silicon wafer. The etch pattern includes a square region on the end of the cantilever, two arms joined to make a triangle cantilever attached to a large rectangular body of silicon nitride which will subsequently be attached to a substrate.

After etch the wafer is spin coated with resist, pits are etched in the now exposed squares only to form pyramidal depressions and a seeding process (described elsewhere in more detail) consisting of either or both an immersion in an ultrasonic bath with nanosized diamond particles and sonicated for some time and/or exposure to a carbon plasma in high vacuum to coat exposed squares. The resist is stripped away and the diamond growth process proceeds filling the pits and leaving a small region around the silicon nitride square evenly coated with diamond. A silicon dioxide overcoat is then made and the parts bonded to a quartz wafer which is later patterned and etched to release the individual parts or at least the parts and a breakaway structure for easily removing the part from the wafer array. Furthermore in this example before the silicon dioxide coat a thick (1 to 2 micron) coating of silicon nitride is laid down over the cantilevers and diamond tips in molds filling any cavity in the molded diamond pyramid. The wafer is then polished on the silicon nitride side down to or nearly to the original silicon nitride film.

A further understanding of the nature and advantages of the present invention may be realized by reference to the remaining portions of the specification and the drawings.

DESCRIPTION OF SPECIFIC EMBODIMENTS

Introduction

Figure 1:
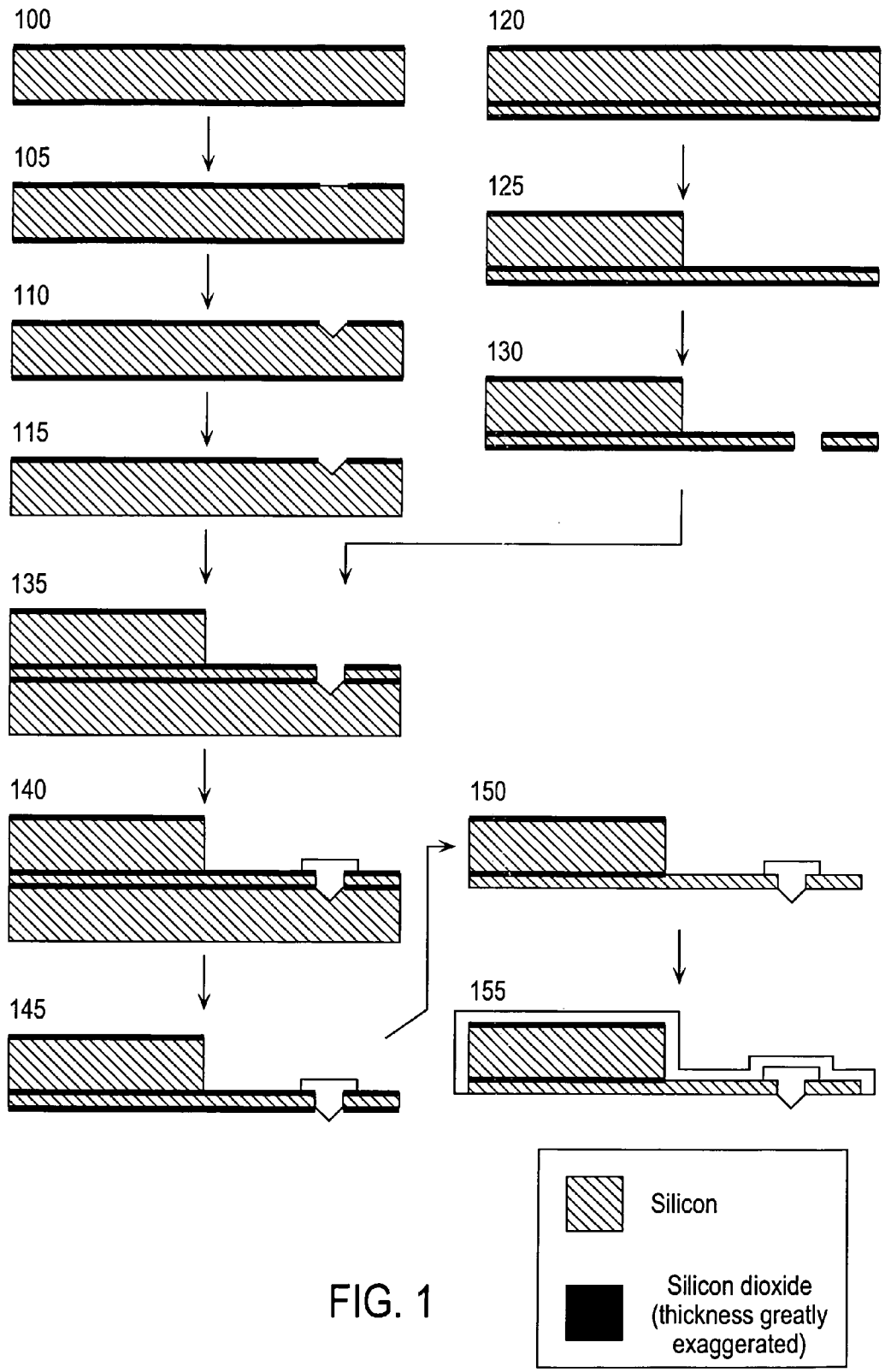
FIG. 1 is a process flow showing wafer cross sections at various stages in the fabrication of a cantilever with a molded diamond tip in one embodiment of the present invention.

FIG. 1 is a process flow showing wafer cross sections at various stages in the fabrication of a cantilever with a molded diamond tip in one embodiment of the present invention. The following table describes the process steps with reference to the wafer cross sections in the figure.

| Step | Description |
| --- | --- |
| 100 | A double-sided polished silicon first wafer is covered with silicon dioxide both sides. |
| 105 | The oxide on the top side of the first wafer is patterned to remove a square of oxide, exposing a square portion of the silicon surface. |
| 110 | The first wafer is wet etched to form a self-limiting four-sided pyramidal pit in the silicon. If the exposed silicon is a non-square rectangle, the pit self limits to a straight edge. |
| 115 | The bottom surface of oxide is removed. The resulting first wafer is one of two wafers that will be combined at step 130. |
| 120 | A silicon-on-oxide second wafer having thick and thin silicon layers is provided. |
| 125 | The second wafer is etched to remove a portion of the thick silicon layer to leave a free-standing portion of the thin silicon layer (covered on both sides with oxide) that will ultimately form the cantilever. |
| 130 | A square hole that is commensurate in size with the square base of the pyramidal pit is etched in the thin layer. |
| 135 | The two wafers are aligned with the square hole in second wafer aligned with the square base of the pyramidal pit in the first wafer. The two wafers are bonded at the oxide surface of the second wafer. |
| 140 | Diamond is grown to fill the pit in the first wafer and overlying hole in the second wafer. |

-continued

| Step | Description |
| --- | --- |
| 145 | The assembly is wet etched to remove the silicon from the first wafer, thereby exposing the molded diamond that formerly occupied the pyramidal pit. |
| 150 | The oxide on the thin layer of the second wafer is removed. |
| 155 | A thick layer of metal or other material like PTFE, epoxy, or plastic may be coated over the cantilever side with the molded diamond, and CMP'd or thermal annealed to provide a final smooth reflective surface. A separate structure can also be bonded to the cantilever to achieve a smooth finish surface. |

Figure 2A:
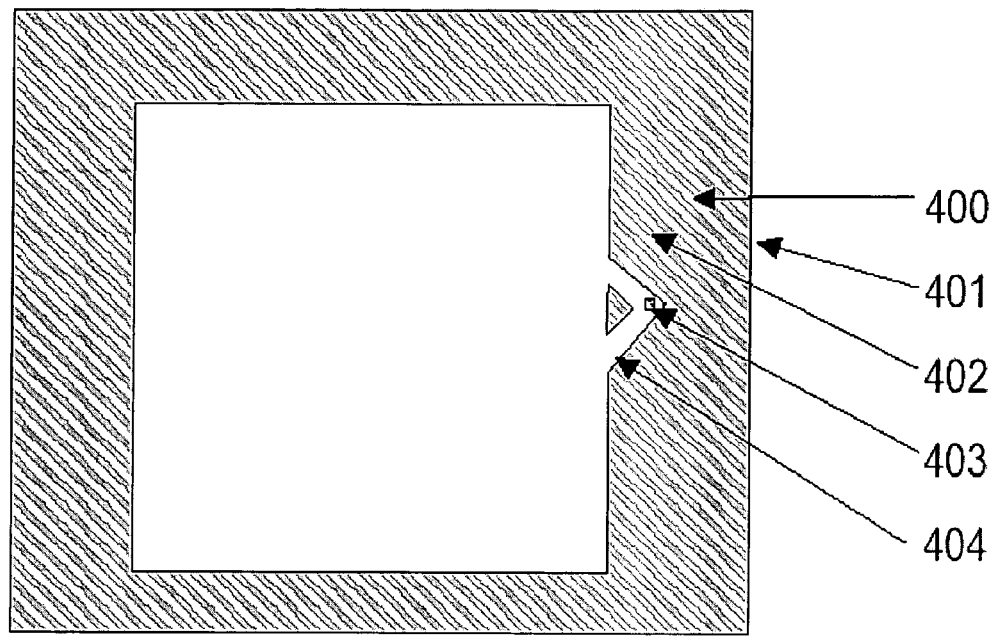
FIG. 2A is top view of a double arm cantilever, diamond tip, and substrate attachment silicon nitride plate in another embodiment of the present invention in which the diamond part is attached to a functional silicon nitride MEMS structure and then bonded to quartz substrates.

In FIG. 2A the subassembly 400 consists of the silicon mold wafer 401, silicon nitride plate 402 with the previously patterned dual arm cantilever 404 and diamond pyramidal tip 403 grown by a rectangle or square etched through the silicon nitride at the apex of the dual arm cantilever. The steps to this subassembly consist of coating the single side polished silicon wafer with a silicon nitride film (from a few nanometers thick up to many microns thick) which is then patterned for the cantilever and the rectangle or square through which the silicon mold will be wet etched and into which (after providing a mechanical and/or barrier layer strippable resist exposing only the diamond mold area) diamond will be seeded and grown.

Figure 2B:
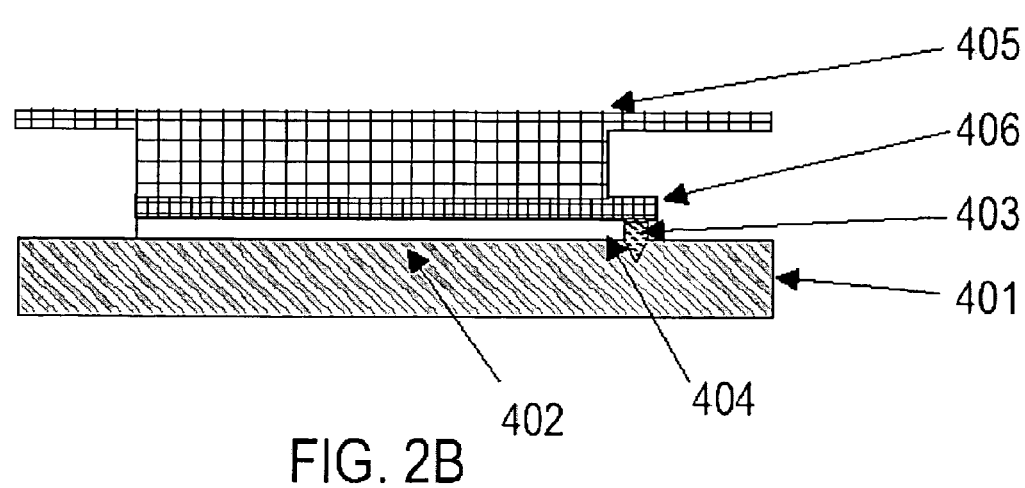
FIG. 2B is a side view of the assembly of FIG. 2A before the silicon mold is etched away.

FIG. 2B includes an additional step of over coating the whole wafer with silicon dioxide and then bonding a breakaway patterned silicon (with silicon dioxide coating) wafer of substrates or quartz wafer of substrates to the silicon nitride support plate. This configuration may be immersed in a bulk wet etch to yield diamond tips bonded to the silicon nitride and in turn mounted and bonded to a wafer of quartz substrates. The figure shows plate 402 and cantilever 404 with molded diamond in the silicon mold and a quartz substrate bonded via a silicon dioxide layer to the silicon nitride plate.

CONCLUSION

While the above is a complete description of specific embodiments of the invention, the above description should not be taken as limiting the scope of the invention as defined by the claims.

What is claimed is:

1. A method of forming a structure that includes a molded diamond structure, the method comprising:
   providing a mold body having a mold body cavity extending into the mold body from an upper surface of the mold body;
   providing a patterned structure atop the mold body, the patterned structure having an aperture aligned with the mold body cavity, wherein the mold body and the patterned structure form a mold structure with a mold cavity defined by the mold body cavity and the aperture;
   molding the diamond structure by growing diamond in the mold cavity so that the diamond structure is bounded by at least the mold body cavity and walls of the aperture;
   releasing the diamond structure from the mold body using a process; and
   separating the patterned structure from the mold body by the same process that is used to release the diamond structure from the mold body.

2. The method of claim 1 in which the patterned structure is itself a component in a MEMS or NEMS structure or device or the precursor to such a MEMS or NEMS structure or device.

3. The method of claim 1 wherein the patterned structure is made from sapphire.

4. The method of claim 1 wherein the patterned structure is made from silicon carbide.

5. The method of claim 1, and further comprising coating and polishing the patterned structure to obtain an optically smooth surface over the portion of the diamond structure formed in the aperture.

6. The method of claim 5 wherein the coating is formed from one or more of silicon carbide, PTFE, silicon nitride, silicon dioxide, sapphire, a metal, a plastic, and an epoxy.

7. The method of claim 1 wherein a secondary structure is bonded to the patterned structure to form an optically smooth surface.

8. The method of claim 1 wherein a substrate is formed by bonding one or more parts to a material including one or more of silicon, plastic metal, glass, quartz, and sapphire.

9. The method of claim 1 wherein the patterned structure is a film of silicon nitride.

10. The method of claim 1 wherein the patterned structure is a film of silicon carbide.

11. The method of claim 1 wherein the patterned structure is a film of diamond, diamond like carbon, carbon nanotubes, inert metals such as gold, palladium, platinum or rhodium.

12. The method of claim 1 wherein the diamond structure does not completely fill the mold cavity but rather includes a recess, and further comprising forming an overcoat and polishing to backfill the recess in the diamond structure.

13. The method of claim 12 in which an overcoat of silicon dioxide permits the patterned structure and diamond structure to be bonded to a corresponding quartz substrate.

14. The method of claim 12 in which an overcoat of silicon dioxide permits the patterned structure and diamond structure to be bonded to a corresponding silicon dioxide coated silicon substrate.

15. The method of claim 1 wherein:
the mold body includes one or more additional mold body cavities;
the patterned structure is formed with one or more additional apertures corresponding to the one or more additional mold body cavities;
the mold structure includes one or more additional mold cavities defined by the one or more additional mold body cavities and the one or more additional apertures; and
one or more additional diamond structures are molded by growing diamond in the one or more additional mold cavities.

16. The method of claim 1 wherein the process used for releasing the diamond structure from the mold body and for separating the patterned structure from mold body includes etching the mold body away from the diamond structure and the patterned structure.

17. The method of claim 1 wherein providing the patterned structure atop the mold body includes bonding the patterned structure to the upper surface of the mold body with the aperture aligned with the mold body cavities.

18. A method of forming a structure that includes a plurality of molded diamond structures, the method comprising:
providing a mold body having a plurality of mold body cavities extending into the mold body from an upper surface of the mold body;
providing a patterned structure having a plurality of apertures corresponding to the mold body cavities;
bonding the patterned structure to the upper surface of the mold body with the apertures aligned with the mold body cavities to form a mold structure with a plurality of mold cavities defined by the mold body cavities and the apertures;
growing diamond in the mold cavities to provide the molded diamond structures, each being bounded by a respective mold body cavity and walls of the corresponding aperture; and
etching the mold body away from the diamond structures and the patterned structure.

* * * * *

UNITED STATES PATENT AND TRADEMARK OFFICE
CERTIFICATE OF CORRECTION

PATENT NO. : 7,598,107 B1
APPLICATION NO. : 11/234066
DATED : October 6, 2009
INVENTOR(S) : Liu et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 871 days.

Signed and Sealed this

Twenty-eighth Day of September, 2010

David J. Kappos
*Director of the United States Patent and Trademark Office*